(12) United States Patent
Liao et al.

(10) Patent No.: US 11,257,673 B2
(45) Date of Patent: Feb. 22, 2022

(54) DUAL SPACER METAL PATTERNING

(71) Applicant: Taiwan Semiconductor Manufacturing Co., Ltd., Hsin-Chu (TW)

(72) Inventors: Yu-Chieh Liao, Taoyuan County (TW); Cheng-Chi Chuang, New Taipei (TW); Chia-Tien Wu, Taichung (TW); Tai-I Yang, Hsinchu (TW); Hsin-Ping Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/543,814

(22) Filed: Aug. 19, 2019

(65) Prior Publication Data
US 2020/0168458 A1   May 28, 2020

Related U.S. Application Data

(60) Provisional application No. 62/771,506, filed on Nov. 26, 2018.

(51) Int. Cl.
| | |
|---|---|
| *H01L 21/033* | (2006.01) |
| *H01L 21/027* | (2006.01) |
| *H01L 21/768* | (2006.01) |
| *H01L 21/311* | (2006.01) |
| *H01L 21/3213* | (2006.01) |

(Continued)

(52) U.S. Cl.
CPC ...... *H01L 21/0337* (2013.01); *H01L 21/0274* (2013.01); *H01L 21/0332* (2013.01); *H01L 21/0335* (2013.01); *H01L 21/0338* (2013.01); *H01L 21/3065* (2013.01); *H01L 21/30625* (2013.01); *H01L 21/31051* (2013.01); *H01L 21/31111* (2013.01); *H01L 21/31122* (2013.01); *H01L 21/31144* (2013.01); *H01L 21/32136* (2013.01); *H01L 21/32139* (2013.01); *H01L 21/76816* (2013.01)

(58) Field of Classification Search
CPC .......... H01L 21/0337; H01L 21/31122; H01L 21/31051; H01L 21/30625; H01L 21/3065; H01L 21/32136; H01L 21/32139; H01L 21/0332; H01L 21/0335; H01L 21/0274; H01L 21/76816; H01L 21/31111; H01L 21/31144; H01L 21/0338; H01L 21/76838
See application file for complete search history.

(56) References Cited

U.S. PATENT DOCUMENTS

| | | | |
|---|---|---|---|
| 6,638,441 B2 * | 10/2003 | Chang | C23F 1/02 |
| | | | 216/46 |
| 7,879,728 B2 * | 2/2011 | Lam | H01L 21/0337 |
| | | | 438/702 |

(Continued)

*Primary Examiner* — Anita K Alanko
(74) *Attorney, Agent, or Firm* — Haynes and Boone, LLP

(57) ABSTRACT

A method for patterning a metal layer includes depositing a hard mask layer on a metal layer, depositing a first patterned layer on the hard mask layer, forming a first set of sidewall spacers on sidewalls of features of the first patterned layer, forming a second set of sidewall spacers on sidewalls of the first set of sidewall spacers, removing the first set of sidewall spacers, and performing a reactive ion etching process to pattern portions of the metal layer exposed through the first patterned layer and the second set of sidewall spacers.

20 Claims, 7 Drawing Sheets

(51) Int. Cl.
*H01L 21/3065* (2006.01)
*H01L 21/3105* (2006.01)
*H01L 21/306* (2006.01)

(56) References Cited

U.S. PATENT DOCUMENTS

| | | | |
|---|---|---|---|
| 8,309,469 B2 * | 11/2012 | Kajiwara | H01L 21/823456 |
| | | | 438/717 |
| 8,796,155 B2 * | 8/2014 | Sills | H01L 21/0273 |
| | | | 438/736 |
| 8,796,666 B1 | 8/2014 | Huang et al. | |
| 8,822,243 B2 | 9/2014 | Yan et al. | |
| 8,987,142 B2 | 3/2015 | Lee et al. | |
| 9,093,530 B2 | 4/2015 | Huang et al. | |
| 9,053,279 B2 | 6/2015 | Chang et al. | |
| 9,099,530 B2 | 8/2015 | Lin et al. | |
| 9,153,478 B2 | 10/2015 | Liu et al. | |
| 9,501,601 B2 | 11/2016 | Chang et al. | |
| 9,548,303 B2 | 1/2017 | Lee et al. | |
| 9,876,114 B2 | 1/2018 | Huang | |
| 2019/0035739 A1 * | 1/2019 | Fang | H01L 21/7684 |
| 2019/0393036 A1 * | 12/2019 | Lin | H01L 21/32133 |
| 2020/0090987 A1 * | 3/2020 | Chandhok | H01L 23/53266 |

* cited by examiner

DUAL SPACER METAL PATTERNING

PRIORITY DATA

This application claims priority to U.S. Provisional Patent Application Ser. No. 62/771,506, filed Nov. 26, 2018, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
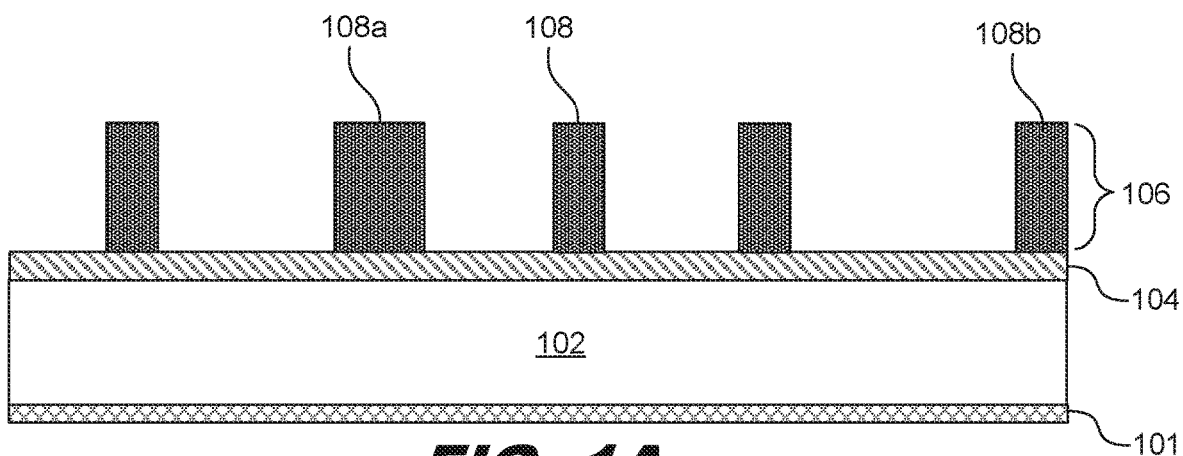
FIGS. 1A, 1B, 1C, 1D, 1E, 1F, 1G, 1H, and 1I are diagrams showing patterning of a metal layer with a dual-spacer process, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to patterning layers within a back-end-of-line (BEOL) portion of an integrated circuit. The BEOL portion of an integrated circuit provides the electrical connections between the transistors and other circuit components that are formed onto a substrate. Generally, the BEOL is made of multiple interconnect layers. Some layers have elongated metal interconnect features. Other layers include vias that connect metal features of a layer above to metal features of a layer below.

Fabricating each metal interconnect layer typically involves multiple masks to pattern that single layer. However, according to principles described herein, a technique for effectively fabricating the metal interconnect lines with a reduced number of masks (in some examples, a single mask) can be realized.

In one example of principles described herein, a hard mask layer is placed on top of a metal layer to be patterned. Then, a first patterned layer is formed on the hard mask. A first spacer deposition process is then applied to form a first type of spacers on sidewalls of features of the first patterned layer. A second spacer deposition process is then applied to form a second type of spacers on the exposed sidewalls of the first type of spacers. Then, the first type of spacers are removed. The pattern formed by the first patterned layer and the second type of sidewall spacers is then transferred to the metal layer by using a dry etching process such as a reactive ion etching process. Using the dual spacer technique described herein, metal layers can be patterned effectively at a lower cost because the technique involves using fewer masks.

FIGS. 1A, 1B, 1C, 1D, 1E, 1F, 1G, 1H, and 1I are diagrams showing patterning of a metal layer with a dual-spacer process. FIG. 1A illustrates a metal layer 102 formed on a workpiece 101. The workpiece may be, for example, a previously formed interconnect layer. In some examples, if the metal layer 102 is the first interconnect layer of the BEOL, then the workpiece 101 may be a contact layer or the front-end-of-line (FEOL) portion of the integrated circuit. The metal layer 102 may be made of a variety of metal materials. In one example, the metal layer 102 includes copper. In one example, the metal layer 102 includes ruthenium. Other conductive materials may be used in place of the metal layer 102 as well.

A hard mask layer 104 is disposed on top of the metal layer. In one example, the hard mask layer includes a nitride material. In one example, the hard mask layer includes multiple layers. For example, the hard mask layer 104 may include a first TEOS/oxide layer, followed by a nitride layer (e.g., titanium nitride), followed by a second TEOS/oxide layer.

A first patterned layer 106 is then formed on the hard mask layer 104. The first patterned layer 106 may be formed through photolithographic processes. For example, the material of the first patterned layer may be deposited on the hard mask layer 104. Then, a photoresist material may be deposited on the material of the first patterned layer. The photoresist material may then be exposed to a light source through a photomask. The portions of the photoresist that are exposed to the light source may then either become soluble or insoluble to a developing solution, depending on the type of mask. The photoresist is then developed with the developing solution, thus exposing portions of the material of the first patterned layer. Then, an etching process, such as a dry etching process is used to remove the exposed portions of the material of the first patterned layer to form the patterned layer 106.

The patterned layer 106 includes a several features 108. These features may be of different sizes. For example, many features 108 of the patterned layer may be of a standard size. However, some features 108a may be a larger size (e.g., 2 two times the size of features 108). Other relationships between sizes may be used as well. In some examples, the pattern of the patterned layer 106 may include dummy features 108b. The dummy features 108b may be placed by an optical proximity correction (OPC) process. The OPC process analyzes a mask design, simulates fabrication, and adds dummy features to improve the formation of the real features.

Figure 1B:
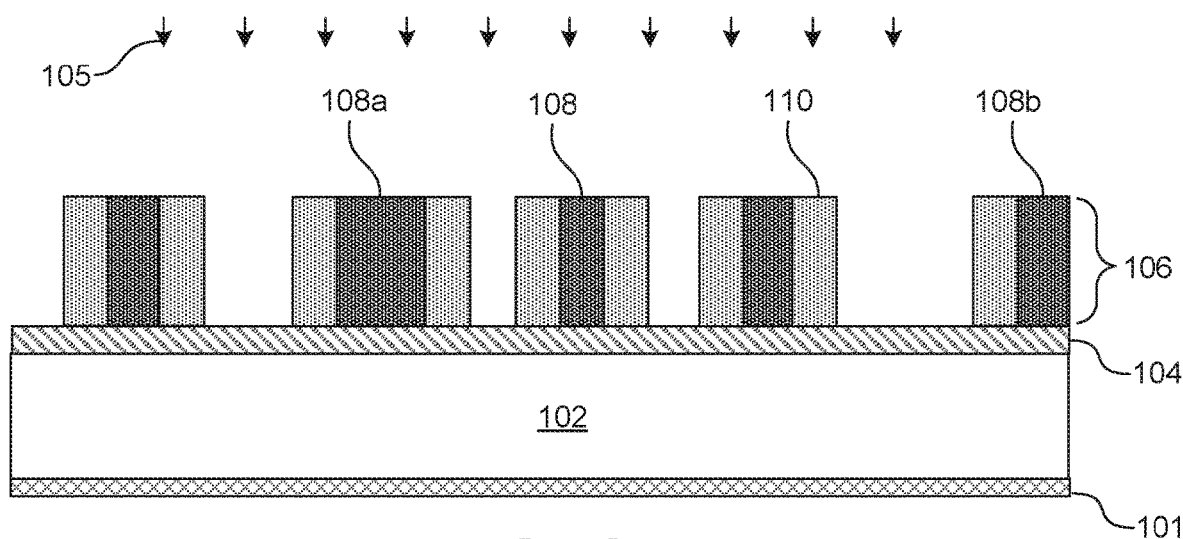

FIG. 1B illustrates a first spacer formation process 105 to form a first type of spacer 110 on sidewalls of the features 108, 108a of the first patterned layer 106. The spacer formation process 105 may include both a deposition process and an etching process. The deposition process may be, for example, an Atomic Layer Deposition (ALD) process. In an ALD process, two different precursors are used to react with the surface of a material in a sequential, alternating, self-limiting manner. In other words, the ALD process deposits material one atomic layer at a time. In this manner, the thickness of the layer can be controlled with greater precision. After the ALD process, the material that is deposited is present on top of the features 108 of the first patterned layer. The material also covers the exposed portions of the hard mask layer 104. Accordingly, an etching process is applied (e.g., dry etching). This etching process is applied for a period of time such that it removes the material from the top of the features 108 and from the exposed portions of the hard mask layer 104, leaving the portions attached to the sidewalls of the features 108.

The first type of spacers 110 may be made from a variety of materials. For example, the first type of spacer materials may be made of a material that can be formed using an ALD process. In one example, the first type of spacer material may be titanium oxide. Other materials for the first type of spacer 110 are contemplated.

Figure 1C:
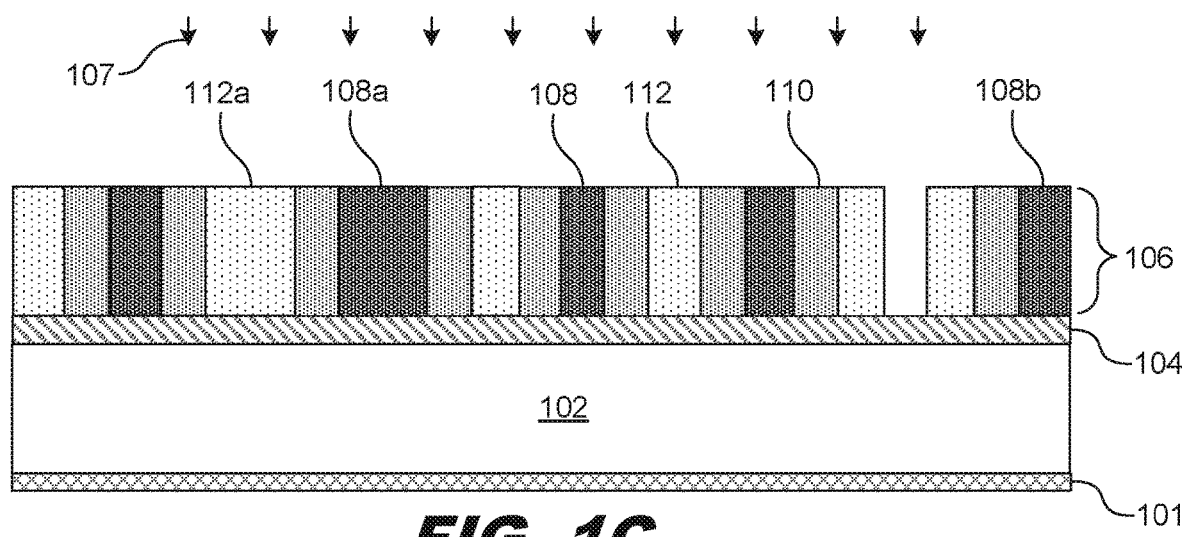

FIG. 1C illustrates a second spacer formation 107 to form a second type of spacer 112 on exposed sidewalls of the first type of spacers 110. The spacer formation process 107 may include both a deposition process and an etching process. The deposition process may be, for example, an ALD process. In this manner, the thickness of the layer can be controlled with greater precision. After the ALD process, the material that is deposited is present on top of the features 108, 110 of the first patterned layer. The material also covers the exposed portions of the hard mask layer 104. Accordingly, an etching process is applied (e.g., dry etching). This etching process is applied for a period of time such that it removes the material from the top of the features 108, 110 and from the exposed portions of the hard mask layer 104, leaving the portions attached to the sidewalls of the features 110.

The second type of spacers 112 may be made from a variety of materials. For example, the second type of spacer materials may be made of a material that can be formed using an ALD process. In one example, the second type of spacer material may be made of a material that can be selectively etched with respect to the first type of spacers 110. Other materials for the first type of spacer 110 are contemplated.

The second type spacers 112 include several features 112. These features may be of different sizes. For example, many features 112 of the patterned layer may be of a standard size. However, some features 112a may be a larger size (e.g., 2 two times the size of features 108). This may be the case in which the spacer material for the second type spacers 112 completely fill the gap between two first type spacer features 110.

Figure 1D:
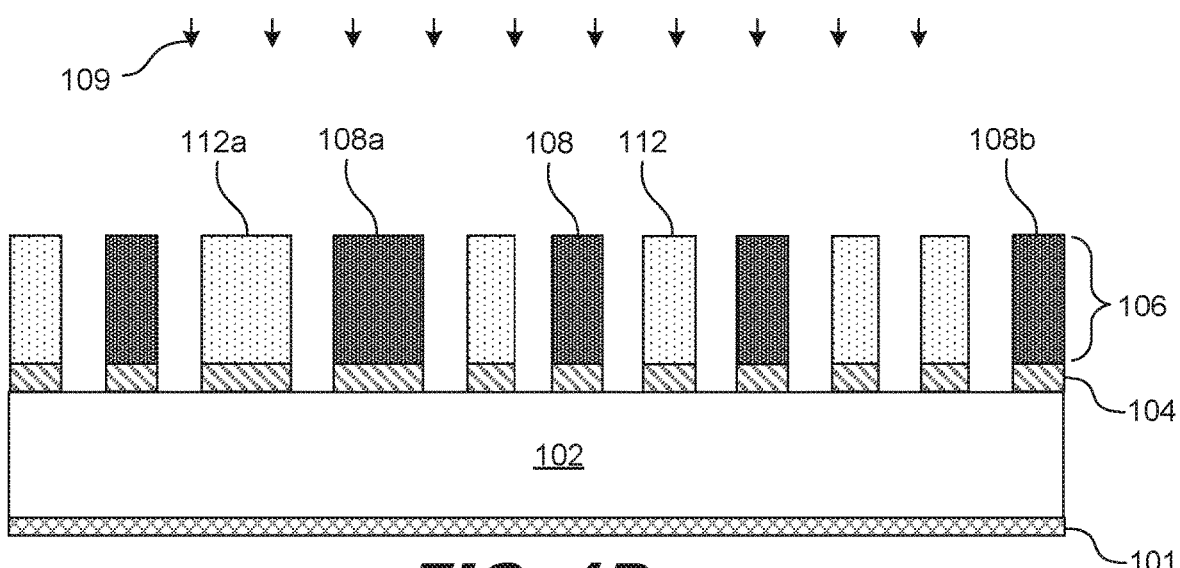

FIG. 1D is a diagram showing an illustrative removal process 109 to remove the first type spacers 110 while leaving the first patterned layer 106 and the second type spacers 112 in place. In some examples, the removal process 109 may include a first etching process that is an isotropic etching process such as a wet etching process. In some examples, however, the etching process may be an anisotropic process such as a dry etching process. The etching process may be designed to be a selective etching so as to remove the first type spacers 110 while leaving the first patterned layer 106 and the second type spacers 112 substantially intact.

Additionally, the removal process 109 may include a further etching process to remove the exposed portions of the hard mask layer 104. This etching process may be a dry etching process. This further etching process exposes the top surface of the metal layer 102.

Figure 1E:
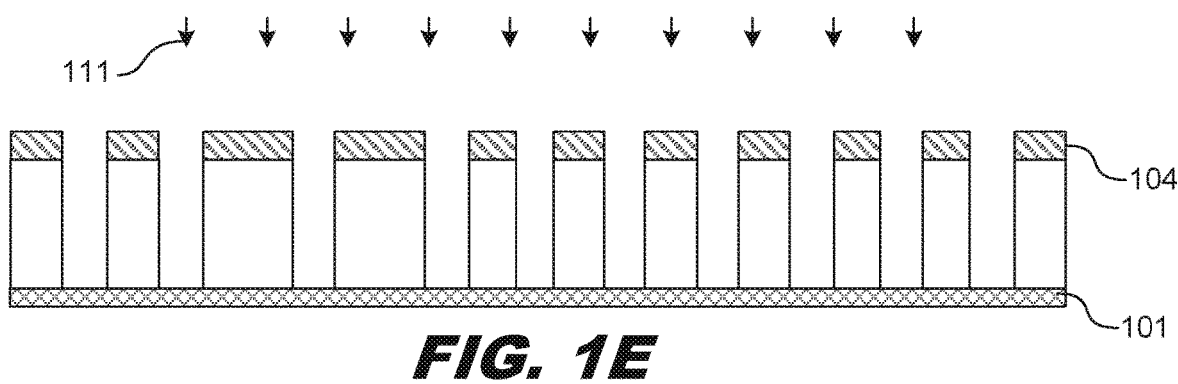

FIG. 1E illustrates a patterning process 111 to transfer the pattern defined by the first patterned layer features 108 and the second type spacers 112 to the underlying metal layer 102. The patterning process may involve, for example a reactive ion etching process. A reactive ion etching process is a type of dry etching that uses chemically reactive plasma to remove the metal material. Specifically, high-energy ions within the plasma react with the metal of the metal layer 102 and remove it. The etching process continues until the top surface of the underlying workpiece 101 is exposed. In some examples, the features 108 of the patterned layer 106 and the second type spacers 112 are removed during this reactive ion etching. In some examples, however, such features can be removed before or after the reactive ion etching process.

Figure 1F:
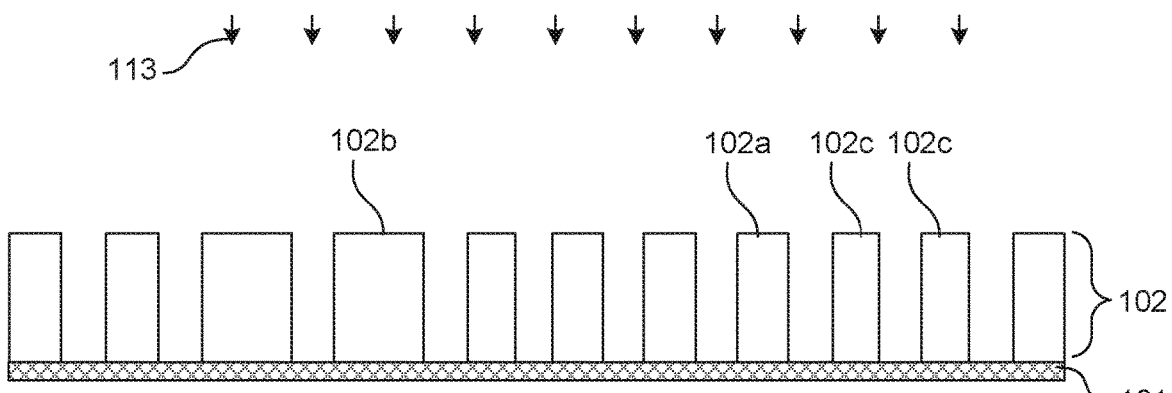

FIG. 1F illustrates a removal process 113 to remove the hard mask layer 104. This removal process 113 may involve a selective etching process that removes the hard mask layer 104 while leaving the metal layer 102 substantially intact. The etching process may be a wet etching process or a dry etching process. After removing the hard mask layer, features 102a, 102b, 102c of the metal layer are fully exposed.

In some examples, there are standard sized features 102a, larger sized features 102b, and dummy features 102c. The dummy features 102c are those that are not used for the integrated circuit but are present as a result of the processes described herein. Specifically, dummy features 102c result from second type spacers 112 formed at certain locations where there is a larger gap between features 108 of the patterned layer 106.

Figure 1G:
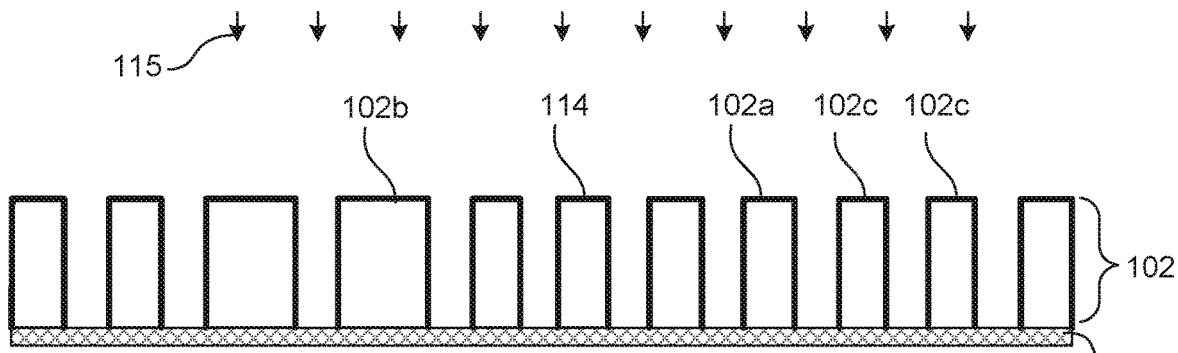

FIG. 1G illustrates a cobalt deposition process 115. The cobalt deposition process forms a cobalt layer 114 over the metal features 102a, 102b, 102c. This improves the electrical properties of the metal features 102a, 102b, 102c.

Figure 1H:
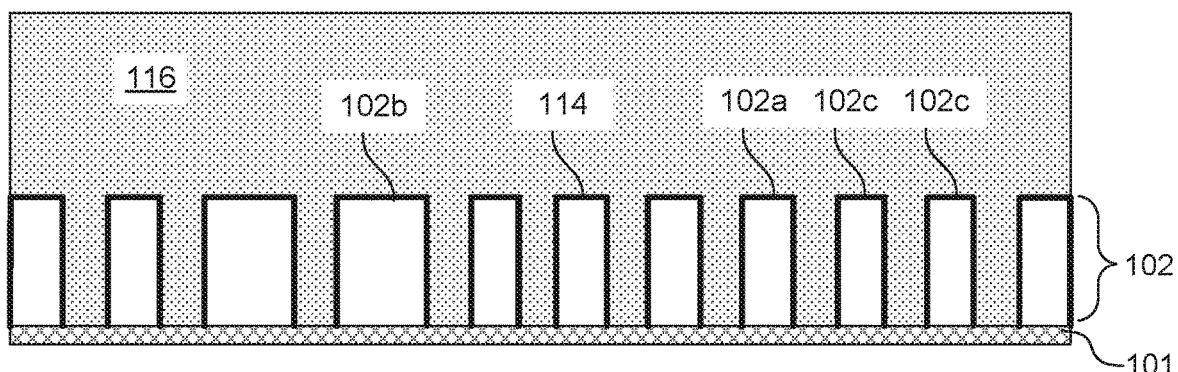

FIG. 1H illustrates deposition of a low-k dielectric material, such as an Interlayer Dielectric (ILD) layer 116. The ILD layer 116 electrically isolates the metal features from each other to allow for proper circuit functionality.

Figure 1I:
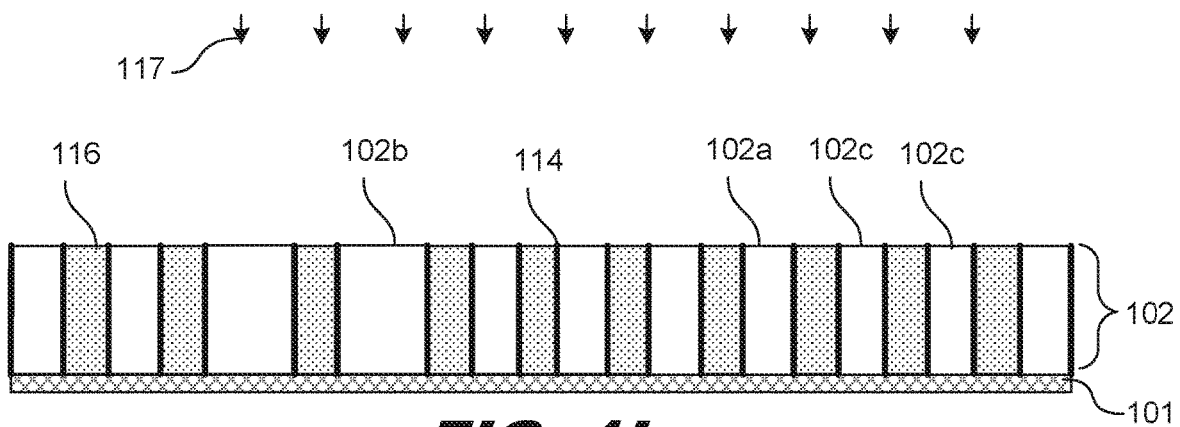

FIG. 1I illustrates a Chemical Mechanical Polishing (CMP) process 117 to planarize the surface of the substrate and expose the top surfaces of the metal features 102a, 102b, 102c. After this, the substrate is ready for further layers. For example, a new metal layer may be applied to form vias between the metal layer 102 and a subsequently formed metal interconnect layer of the BEOL.

Figure 2A:
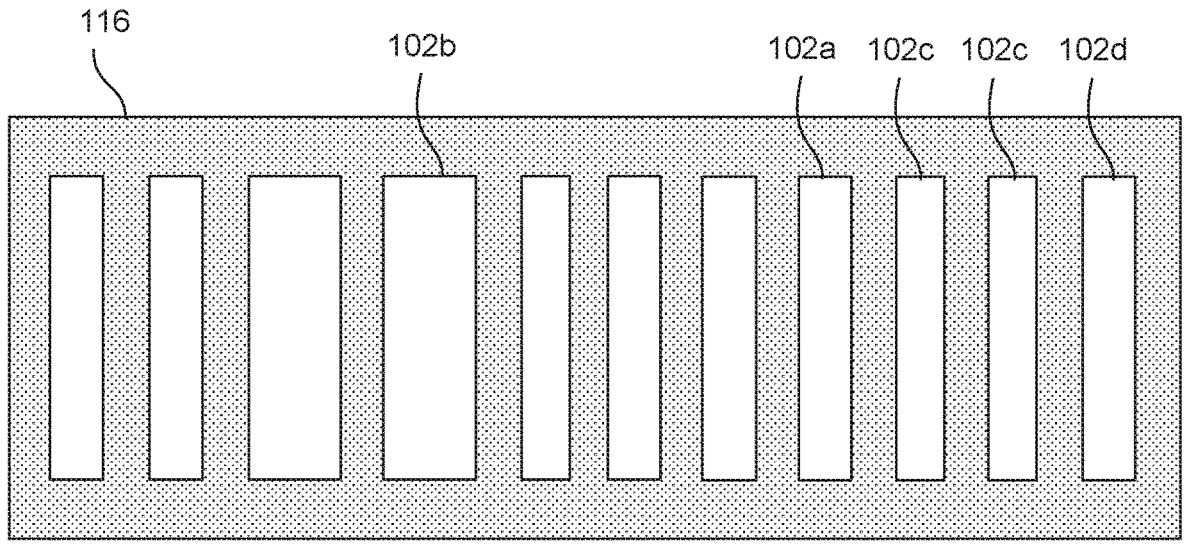
FIGS. 2A and 2B are diagrams showing a top view of the pattern formed in the processes described in FIGS. 1A-1I, according to one example of principles described herein.
Figure 2B:
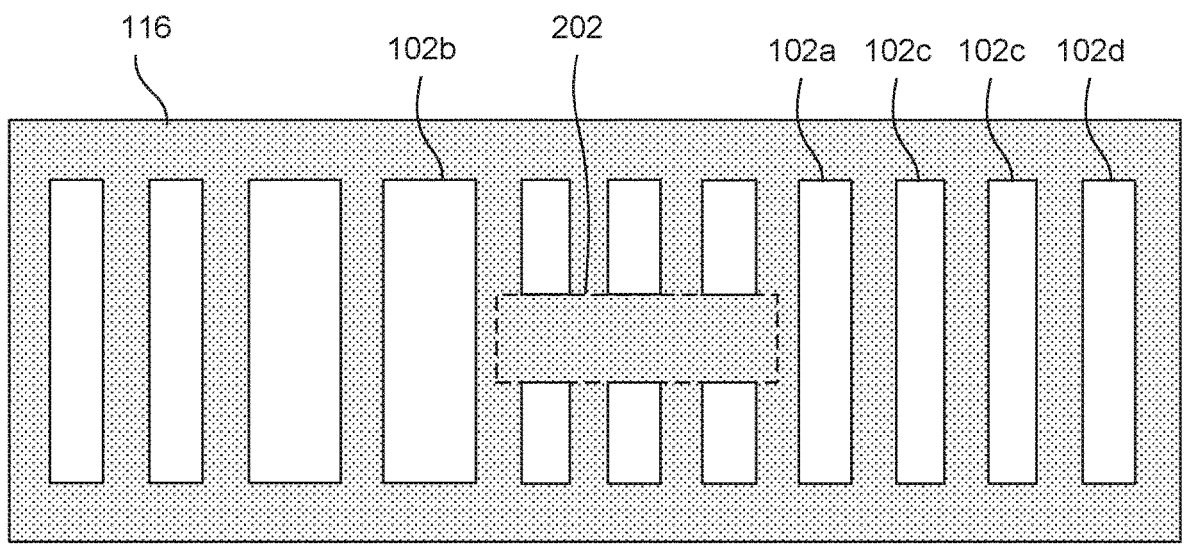

FIGS. 2A and 2B are diagrams showing a top view of the pattern formed in the processes described in FIGS. 1A-1I. FIG. 2A illustrates a top view of various features. Particularly, there are standard sized features 102a, larger features 102b, dummy features 102c, and OPC dummy features 102d. Each of these features 102a, 102b, 102c, 102d is surrounded by the ILD layer 116.

FIG. 2B illustrates an example in which a cut feature 202 is used. Cut features may be applied at either the first spacer deposition process 105 or the second spacer deposition process 107. For example, a cut feature may be formed through photolithographic processes after the spacer material for the first type spacer is deposited and before the first type spacer material is etched. Thus, the first type spacer material may remain in place and prevent metal features from being formed at that part of the pattern. Similarly, a cut feature may be formed through photolithographic processes after the spacer material for the second type spacer is deposited and before the second type spacer material is etched. Thus, the second type spacer material may remain in place and prevent metal features from being formed at that part of the pattern.

Figure 3A:
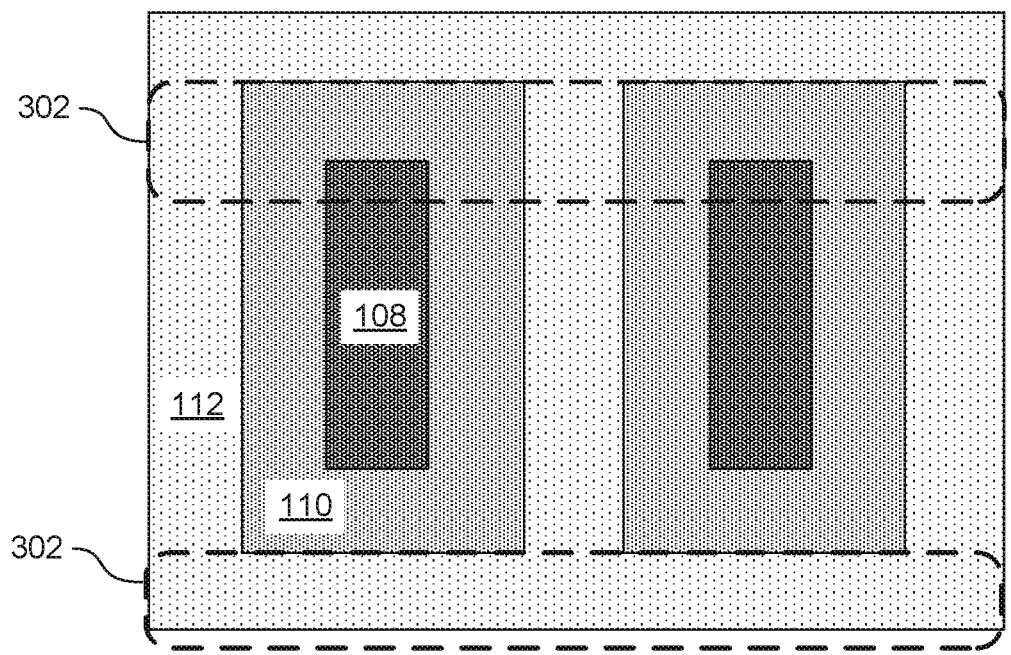
FIGS. 3A and 3B are diagrams showing illustrative cut features, according to one example of principles described herein.
Figure 3B:
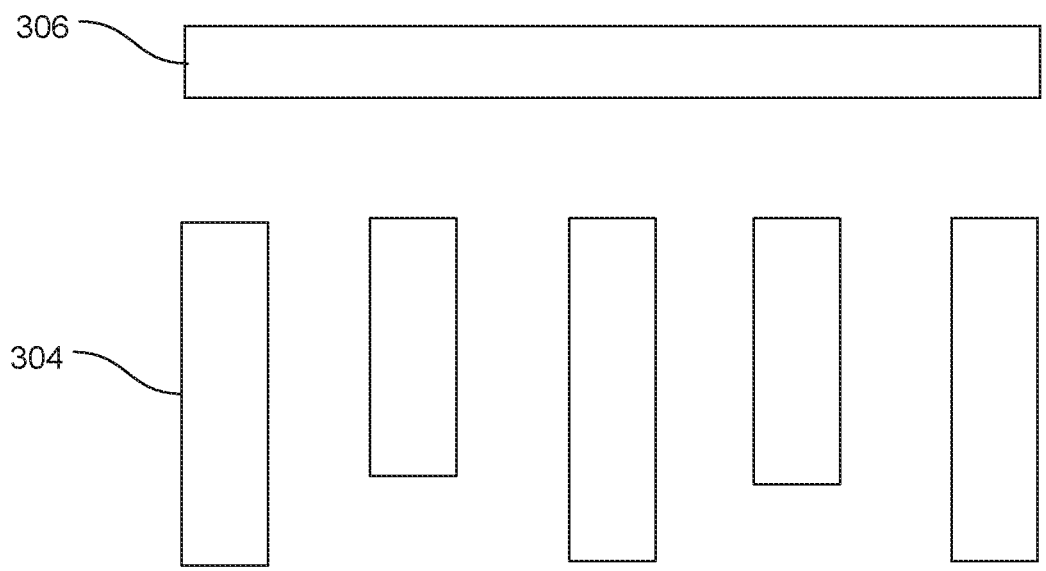

FIGS. 3A and 3B are diagrams showing illustrative cut features 302. Specifically, FIG. 3A illustrates a top view of a semiconductor device after the first spacer deposition process 105 and the second spacer deposition process 107. FIG. 3A also illustrates an example placement of cut features 302. The cut features 302 define an area in which the pattern is not transferred to the underlying metal layer. Such cut features may be formed in a variety of manners at various stages of the processes described above. Cut features 302 can be used to cut an otherwise circuitous feature, such as a square shape, into two parallel lines.

FIG. 3B illustrates the pattern printed into the metal layer for the device shown in FIG. 3A. According to the present example, the cut features 302 that are used to fabricate a functional circuit using the principles described herein result in a dummy feature 306 that extends perpendicularly to the real features 304. The real features 304 include a set of elongated parallel lines. Such lines are real features 304 because they are used to carry electrical current for the final integrated circuit. The dummy feature 306 does not contribute to the functionality of the final integrated circuit. Such perpendicularly placed dummy features 306 may be present no matter how the cut features 302 are used during the fabrication process.

Figure 4:
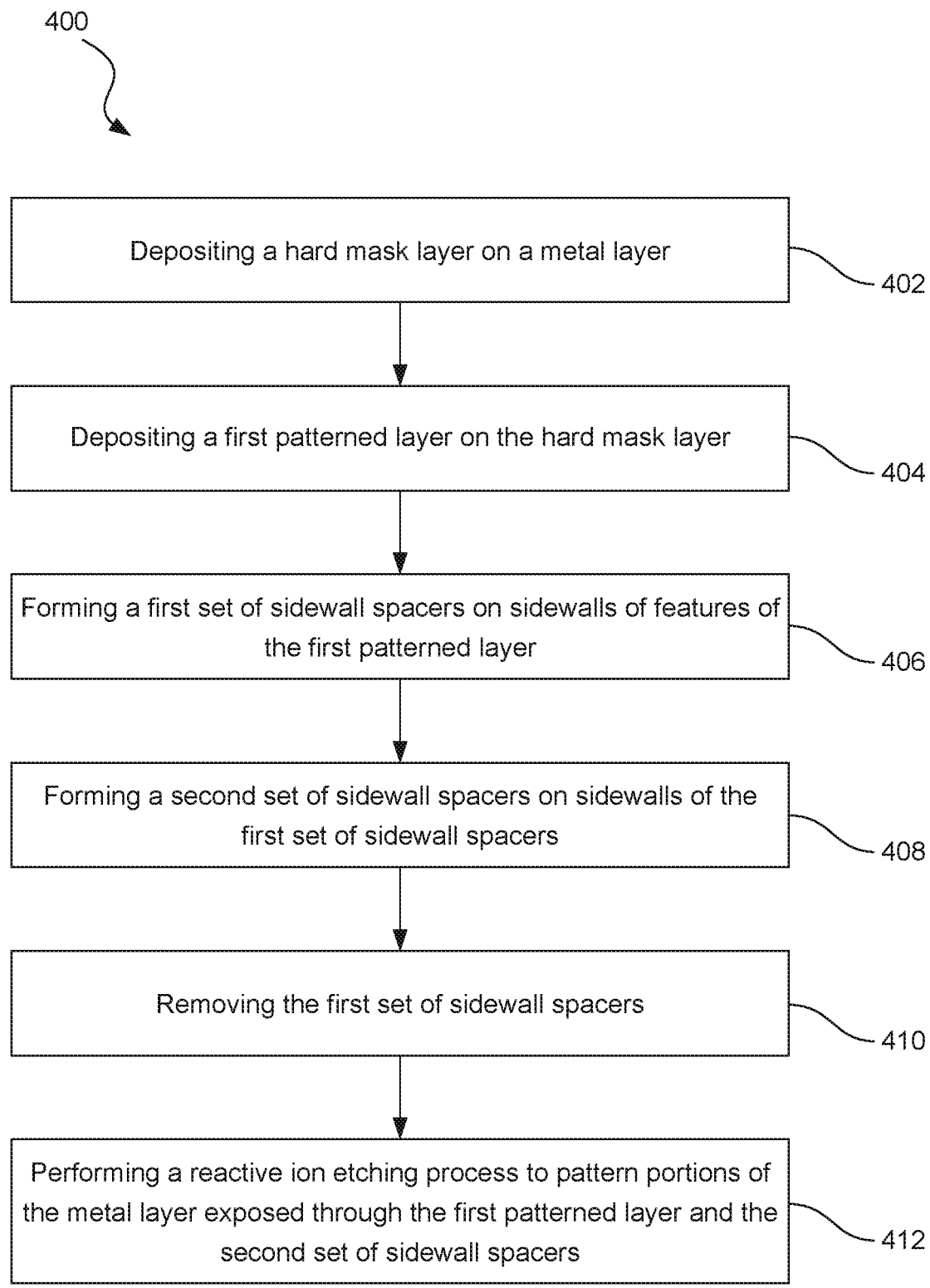
FIG. 4 is a flowchart showing an illustrative method for patterning a metal layer with a dual spacer process, according to one example of principles described herein.

FIG. 4 is a flowchart showing an illustrative method 400 for patterning a metal layer (e.g., 102) with a dual spacer process. According to the present example, the method 400 includes a process 402 for depositing a hard mask layer (e.g., 104) on a metal layer. In one example, the hard mask layer includes a nitride material. In one example, the hard mask layer includes multiple layers. For example, the hard mask layer may include a first TEOS/oxide layer, followed by a nitride layer (e.g., titanium nitride), followed by a second TEOS/oxide layer.

In some examples, the metal layer may be an interconnect layer of the BEOL. The metal layer may be made of a variety of metal materials. In one example, the metal layer includes copper. In one example, the metal layer includes ruthenium. Other conductive materials may be used in place of the metal layer as well The method 400 further includes a process 404 for depositing a first patterned layer (e.g., 106) on the hard mask layer. The first patterned layer may be formed through photolithographic processes. For example, the material of the first patterned layer may be deposited on the hard mask layer. Then, a photoresist material may be deposited on the material of the first patterned layer. The photoresist material may then be exposed to a light source through a photomask. The portions of the photoresist that are exposed to the light source may then either become soluble or insoluble to a developing solution, depending on the type of mask. The photoresist is then developed with the developing solution, thus exposing portions of the material of the first patterned layer. Then, an etching process, such as a dry etching process is used to remove the exposed portions of the material of the first patterned layer to form the patterned layer. In some examples, the patterned layer 106 may include features (e.g., 108, 108a) of various sizes. In some examples, the patterned layer 106 may include dummy features 108b as a result of an OPC process.

The method 400 further includes a process 406 for forming a first set of sidewall spacers on sidewalls of features of the first patterned layer. The spacer formation process (e.g., 105) may include both a deposition process and an etching process. The deposition process may be, for example, an ALD process. In this manner, the thickness of the layer can be controlled with greater precision. After the ALD process, the material that is deposited is present on top of the features of the first patterned layer. The material also covers the exposed portions of the hard mask layer. Accordingly, an etching process is applied (e.g., dry etching). This etching process is applied for a period of time such that it removes the material from the top of the features and from the exposed portions of the hard mask layer, leaving the portions attached to the sidewalls of the features.

The first type of spacers may be made from a variety of materials. For example, the first type of spacer materials may be made of a material that can be formed using an ALD process. In one example, the first type of spacer material may be titanium oxide. Other materials for the first type of spacer are contemplated.

The method 400 further includes a process 408 for forming a second set of sidewall spacers on sidewalls of the first set of sidewall spacers. The spacer formation process (e.g., 107) may include both a deposition process and an etching process. The deposition process may be, for example, an ALD process. In this manner, the thickness of the layer can be controlled with greater precision. After the ALD process, the material that is deposited is present on top of the features of the first patterned layer. The material also covers the exposed portions of the hard mask layer. Accordingly, an etching process is applied (e.g., dry etching). This etching process is applied for a period of time such that it removes the material from the top of the features and from the exposed portions of the hard mask layer, leaving the portions attached to the sidewalls of the features.

The second type of spacers may be made from a variety of materials. For example, the second type of spacer materials may be made of a material that can be formed using an ALD process. In one example, the second type of spacer material may be made of a material that can be selectively etched with respect to the first type of spacers. Other materials for the first type of spacer are contemplated.

The second type spacers include several features. These features may be of different sizes. For example, many features of the patterned layer may be of a standard size. However, some features may be a larger size. This may be the case in which the spacer material for the second type spacers completely fill the gap between two first type spacer features.

The method 400 may further include a process 410 for removing the first set of sidewall spacers. In some examples, the removal process (e.g., 109) may include a first etching process that is an isotropic etching process such as a wet etching process. In some examples, however, the etching process may be an anisotropic process such as a dry etching process. The etching process may be designed to be a selective etching so as to remove the first type spacers while leaving the first patterned layer and the second type spacers substantially intact.

Figure 5:
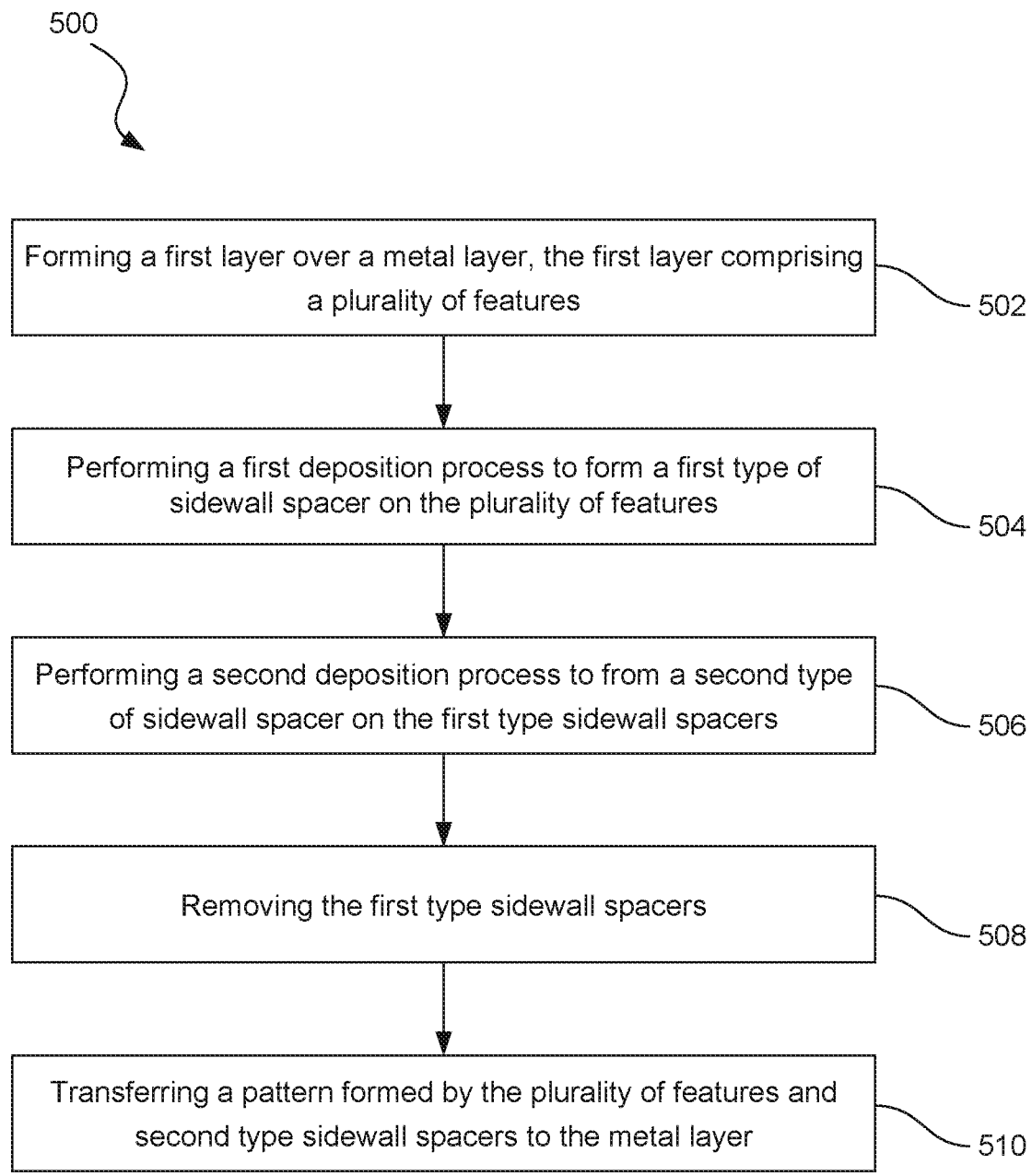
FIG. 5 is a flowchart showing an illustrative method for patterning a metal layer with a dual spacer process, according to one example of principles described herein.

The method 400 may further includes a process 412 for performing a reactive ion etching process (e.g., 111) to pattern portions of the metal layer exposed through the first patterned layer and the second set of sidewall spacers. A reactive ion etching process is a type of dry etching that uses chemically reactive plasma to remove the metal material. Specifically, high-energy ions within the plasma react with the metal of the metal layer and remove it. The etching process continues until the top surface of the underlying workpiece is exposed. In some examples, the features of the patterned layer and the second type spacers are removed during this reactive ion etching. In some examples, however, such features can be removed before or after the reactive ion etching process. Using the dual spacer technique described herein, metal layers can be patterned effectively at a lower cost because the technique involves using fewer masks FIG. 5 is a flowchart showing an illustrative method 500 for patterning a metal layer with a dual spacer process. According to the present example, the method 500 includes a process 502 for forming a first layer (e.g., 106) over a metal layer (e.g., 102), the first layer comprising a plurality of features (e.g., 108, 108a, 108b). The first layer includes a several features. These features may be of different sizes. For example, many features of the first layer may be of a standard size. However, some features may be a larger size. Other relationships between sizes may be used as well. In some examples, the pattern of the first layer may include dummy features. The dummy features may be placed by an optical proximity correction (OPC) process. The OPC process analyzes a mask design, simulates fabrication, and adds dummy features to improve the formation of the real features.

The method 500 further includes a process 504 for performing a first deposition process to form a first type of sidewall spacer on the plurality of features. The spacer formation process (e.g., 105) may include the first deposition process and an etching process. The deposition process may be, for example, an ALD process. In this manner, the thickness of the layer can be controlled with greater precision. After the ALD process, the material that is deposited is present on top of the features of the first patterned layer. The material also covers the exposed portions of the hard mask layer. Accordingly, an etching process is applied (e.g., dry etching). This etching process is applied for a period of time such that it removes the material from the top of the features and from the exposed portions of the hard mask layer, leaving the portions attached to the sidewalls of the features.

The first type of spacers may be made from a variety of materials. For example, the first type of spacer materials may be made of a material that can be formed using an ALD process. In one example, the first type of spacer material may be titanium oxide. Other materials for the first type of spacer are contemplated.

The method further includes a process 506 for performing a second deposition process to from a second type of sidewall spacer on the first type sidewall spacers. The spacer formation process (e.g., 107) may include both the second deposition process and an etching process. The deposition process may be, for example, an ALD process. In this manner, the thickness of the layer can be controlled with greater precision. After the ALD process, the material that is deposited is present on top of the features of the first patterned layer. The material also covers the exposed portions of the hard mask layer. Accordingly, an etching process is applied (e.g., dry etching). This etching process is applied for a period of time such that it removes the material from the top of the features and from the exposed portions of the hard mask layer, leaving the portions attached to the sidewalls of the features.

The second type of spacers may be made from a variety of materials. For example, the second type of spacer materials may be made of a material that can be formed using an ALD process. In one example, the second type of spacer material may be made of a material that can be selectively etched with respect to the first type of spacers. Other materials for the first type of spacer are contemplated.

The method 500 further includes a process 508 for removing the first type sidewall spacers. In some examples, the removal process (e.g., 109) may include a first etching process that is an isotropic etching process such as a wet etching process. In some examples, however, the etching process may be an anisotropic process such as a dry etching process. The etching process may be designed to be a selective etching so as to remove the first type spacers while leaving the first patterned layer and the second type spacers substantially intact.

The method 500 further includes a process 510 for transferring a pattern formed by the plurality of features and second type sidewall spacers to the metal layer. The transferring process may involve, for example a reactive ion etching process. A reactive ion etching process is a type of dry etching that uses chemically reactive plasma to remove the metal material. Specifically, high-energy ions within the plasma react with the metal of the metal layer and remove it. The etching process continues until the top surface of the underlying workpiece is exposed. In some examples, the features of the patterned layer and the second type spacers are removed during this reactive ion etching. In some examples, however, such features can be removed before or after the reactive ion etching process.

According to one example, a method for patterning a metal layer includes depositing a hard mask layer on a metal layer, depositing a first patterned layer on the hard mask layer, forming a first set of sidewall spacers on sidewalls of features of the first patterned layer, forming a second set of sidewall spacers on sidewalls of the first set of sidewall spacers, removing the first set of sidewall spacers, and performing a reactive ion etching process to pattern portions of the metal layer exposed through the first patterned layer and the second set of sidewall spacers.

According to one example, a method includes forming a first layer over a metal layer, the first layer comprising a plurality of features, performing a first deposition process to form a first type of sidewall spacer on the plurality of features, performing a second deposition process to from a second type of sidewall spacer on the first type sidewall spacers, removing the first type sidewall spacers, and transferring a pattern formed by the plurality of features and second type sidewall spacers to the metal layer.

According to one example, a device includes a layer within a Back-end-of-line (BEOL), the layer comprising, a plurality of elongated metal features positioned in parallel, the plurality of elongated metal features extending in a first direction, and at least one dummy elongated metal feature extending in a second direction that is perpendicular to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a hard mask layer on a first metal layer;
    depositing a first patterned layer on the hard mask layer;
    forming a first set of sidewall spacers on sidewalls of features of the first patterned layer, wherein at least one feature of the first patterned layer has a top surface facing away from the first metal layer that is free of the first set of sidewall spacers after the forming of the first set of sidewall spacers on sidewalls of features of the first patterned layer;
    forming a second set of sidewall spacers on sidewalls of the first set of sidewall spacers;
    removing the first set of sidewall spacers;
    performing a reactive ion etching process to pattern portions of the first metal layer exposed through the first patterned layer and the second set of sidewall spacers;
    forming a second metal layer directly on the patterned portions of the first metal layer such that the second metal layer physically contacts the patterned portions of the first metal layer;
    forming an interlayer dielectric layer directly on the second metal layer such that the interlayer dielectric layer physically contacts the second metal layer; and
    performing a planarization process to remove portions of the interlayer dielectric layer and portions of the second metal layer to expose the patterned portions of the first metal layer.

2. The method of claim 1, wherein the first patterned layer comprises a dummy feature.

3. The method of claim 1, wherein a subset of features associated with the second set of sidewall spacers comprise dummy features.

4. The method of claim 1, wherein the first set of sidewall spacers and the second set of sidewall spacers are formed by an Atomic Layer Deposition (ALD) process.

5. The method of claim 1, wherein the metal layer comprises at least one of: ruthenium or copper.

6. The method of claim 1, wherein features formed from the metal layer comprise interconnect features of a Back-end-of-line (BEOL).

7. The method of claim 1, further comprising, removing the first patterned layer, the second set of sidewall spacers, and the hard mask layer to expose metal features formed from the metal layer.

8. A method comprising:
    forming a first layer over a first metal layer that is disposed over a substrate, the first layer comprising a plurality of features;
    performing a first deposition process to form a first set of sidewall spacers on sidewalls of the plurality of features;
    performing a second deposition process to from a second set of sidewall spacers on sidewalls of the first set of sidewall spacers;
    removing the first set of sidewall spacers;
    transferring a pattern formed by the plurality of features and second set of sidewall spacers to the first metal layer;
    after transferring the pattern, forming a second metal layer directly on a first metal feature of the patterned first metal layer such that the second metal layer physically contacts opposing sidewalls and a topmost surface of the metal feature, the topmost surface extending from one of the opposing sidewalls to the other of the opposing sidewalls of the metal feature and facing away from the substrate, wherein the patterned first metal layer further includes a second metal feature, wherein the second metal layer has a first sidewall surface extending along one of the sidewalls of the first metal feature and a second sidewall surface extending along a sidewall of the second metal feature, wherein the first sidewall surface opposes the second sidewall surface such that a trench extends form the first sidewall surface to the opposing the second sidewall surface; and
    forming an interlayer dielectric layer in the trench directly on the first sidewall surface and the second sidewall surface of the second metal layer.

9. The method of claim 8, wherein transferring the pattern comprises performing an etching process to exposed portions of the metal layer.

10. The method of claim 9, wherein the etching process comprises a reactive ion etching process.

11. The method of claim 9, wherein the etching process comprises a dry etching process.

12. The method of claim 8, wherein the first deposition process and the second deposition process comprise an Atomic Layer Deposition (ALD) process.

13. The method of claim 8, further comprising, forming cut features before after forming the first set of sidewall spacers and before forming the second set of sidewall spacers.

14. The method of claim 8, further comprising, forming cut features after forming the second set of sidewall spacers.

15. A method comprising:

forming a hard mask layer on a first metal layer disposed over a substrate;

forming a first patterned layer on the hard mask layer, the first patterned layer including a first feature and a second feature such that a first space is defined between the first and second features;

forming a first sidewall spacer in the first space directly on a sidewall of the first feature and a second sidewall spacer in the first space directly on a sidewall of the second feature;

forming a third sidewall spacer in the first space directly on the first and second sidewall spacers such that the first space is completely filled by the first, second and third sidewall spacers;

removing the first and second sidewall spacers;

patterning the hard mask layer while using the first and second features and the third sidewall spacer as a mask;

patterning the first metal layer while using the patterned hard mask layer as a mask, the patterned first metal layer including a first metal feature having a top surface covered by the patterned hard mask layer after the patterning of the first metal layer and a second metal feature, wherein a second space is defined between the first and second metal features;

removing the patterned hard mask layer to expose the top surface of the first metal feature; and forming a second metal layer directly on the first metal feature and the second metal feature such that the second metal layer physically contacts the first metal feature and the second metal feature, wherein the second metal layer formed directly on the first and second metal features defines a recess; and forming an interlayer dielectric layer in the recess directly on the second metal layer such that the interlayer dielectric layer physically contacts the second metal layer.

16. The method of claim 15, wherein the first and second features and the third sidewall spacer are removed during the patterning of the first metal layer while using the patterned hard mask layer as a mask.

17. The method of claim 15, wherein the metal feature is a metal interconnect line that is part of an interconnect structure.

18. The method of claim 1, wherein the second metal layer includes cobalt.

19. The method of claim 1, wherein after the removing of the first set of sidewall spacers, a top surface of a first sidewall spacer of the second set of sidewall spacers is coplanar with the top surface of the at least one feature of the first patterned layer.

20. The method of claim 1, wherein after the removing of the first set of sidewall spacers, a first sidewall spacer from the second set of sidewall spacers has a first width and a second sidewall spacer from the second set of sidewall spacers has a second width that is different than the first width.

* * * * *